(12) United States Patent
Yoshizawa

(10) Patent No.: US 6,542,007 B2
(45) Date of Patent: Apr. 1, 2003

(54) INVERTER CIRCUIT

(75) Inventor: Hirokazu Yoshizawa, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/990,573

(22) Filed: Nov. 21, 2001

(65) Prior Publication Data

US 2002/0153926 A1 Oct. 24, 2002

(30) Foreign Application Priority Data

Nov. 22, 2000 (JP) .......................................... 2000-355970

(51) Int. Cl.[7] ........................ H03K 19/20; H03K 19/094
(52) U.S. Cl. ........................ 326/120; 326/117; 326/121; 326/112

(58) Field of Search ................................ 326/112, 115, 326/119, 120, 121, 122

(56) References Cited

U.S. PATENT DOCUMENTS 4,578,694 A * 3/1986 Ariizumi et al. ............... 357/41
5,834,962 A * 11/1998 Okamoto ..................... 327/333

* cited by examiner

*Primary Examiner*—Daniel Chang
(74) *Attorney, Agent, or Firm*—Brinks Hofer Gilson & Lione

(57) ABSTRACT

An inverter circuit is disclosed that prevents flow of a large feedthrough current. The inverter circuit includes depletion type MOS transistor combined with a resistor to impose a current limitation when a feedthrough current flows.

14 Claims, 6 Drawing Sheets

INVERTER CIRCUIT

BACKGROUND OF THE INVENTION

1. Field of the Invention

The present invention relates to an inverter circuit with a small feedthrough current.

2. Related Background Art

An example of a conventional inverter circuit is shown in FIG. 2. The conventional inverter circuit operates as described below.

An input voltage is supplied from an input terminal 205. If the input voltage is VDD, no voltage is generated between the gate and source of a PMOS transistor 201, so that the PMOS transistor 201 is placed in a cutoff state. On the other hand, the gate terminal and drain terminal of an NMOS transistor 202 are connected to each other, so that the impedance of the NMOS transistor 202 is small as viewed from an output terminal 206. Accordingly, a voltage close to VSS or VSS is supplied to the output terminal 206.

A potential difference occurs between the gate and source of the PMOS transistor 201 in accordance with the gradual reduction of the input voltage from VDD. When a voltage Vsg between the gate and source of the PMOS transistor 201 becomes larger than the absolute value of a threshold value voltage of the PMOS transistor 201, the impedance between the drain and source of the PMOS transistor 201 starts to be decreased and the potential at the output terminal 206 starts to be increased.

When the input voltage reaches VSS, there occurs a potential difference corresponding to a power supply voltage (VDD−VSS) between the gate and source of the PMOS transistor 201, so that the impedance between the drain and source of the PMOS transistor 201 assumes a minimum value. At this point in time, the potential at the output terminal 206 approaches VDD if the transistor sizes are determined so that the impedance between the drain and source of the PMOS transistor 201 is much smaller than the impedance between the drain and source of the NMOS transistor 202.

In this manner, the circuit shown in FIG. 2 operates as an inverter.

The conventional inverter circuit, however, has a problem in that a feedthrough current is increased as the input voltage approaches VSS, which increases current consumption. This is because the impedance between the drain and source of the PMOS transistor and the impedance between the drain and source of the NMOS transistor are both decreased when the input voltage becomes VSS.

SUMMARY OF THE INVENTION

To solve the above problem, in accordance with the present invention, a depletion type NMOS transistor is combined with a resistor so that a current limitation is imposed when a feedthrough current starts to flow. An inverter circuit constructed in this manner has a characteristic that a large feedthrough current does not flow even if an input voltage approaches VSS.

DETAILED DESCRIPTION OF THE PREFERRED EMBODIMENT

Figure 1:
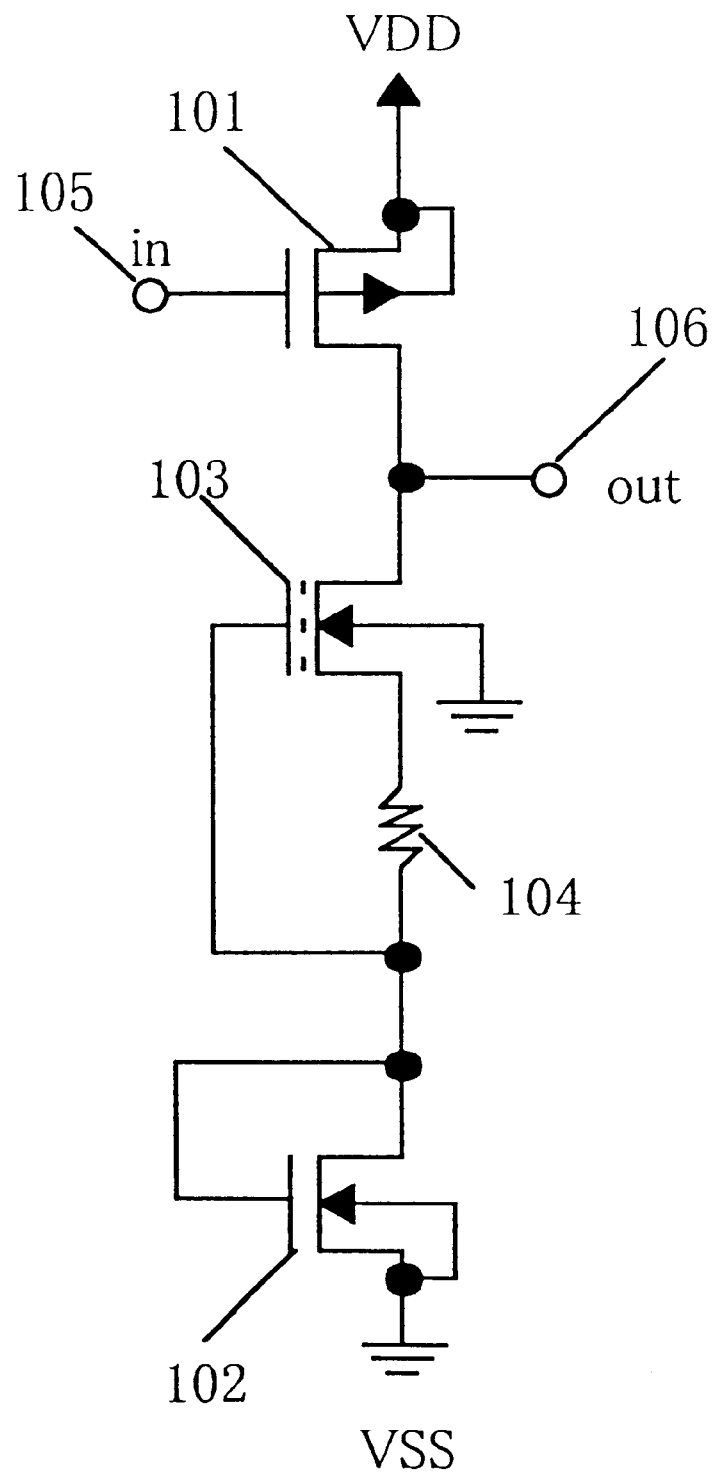
FIG. 1 shows the construction of an inverter circuit according to the present invention.

An embodiment of the present invention will be described below with reference to the drawings. FIG. 1 shows an example of the construction of an inverter circuit according to the present invention.

A depletion type NMOS transistor 103 and a resistor 104 are provided to limit current flowing through a path composed of a PMOS transistor 101 and an NMOS transistor 102. In FIG. 1, a voltage VDD is supplied to the source terminal (source) of the PMOS transistor 101. An input signal is supplied to an input terminal 105 connected with the gate terminal (gate) of the PMOS transistor 101. The drain terminal (drain) of the PMOS transistor 101 is connected with the drain of the depletion type NMOS transistor 103 and an output signal is extracted from an output terminal 106. The source of the depletion type NMOS transistor 103 is connected with one side of a resistor 104. The other side of the resistor 104 is connected with the gate of the depletion type NMOS transistor 103 and with the drain and gate of the NMOS transistor 102. The source of the NMOS transistor 102 is connected with VSS.

By way of example, how the present inverter circuit operates when the potential at the input terminal 105 drops from VDD to VSS will be described. As the voltage supplied to the input terminal 105 decreases, a large potential difference occurs between the gate and source of the PMOS transistor 101, so that current flowing through the PMOS transistor 101 starts to increase. At this point in time, the increase in the flowing current causes an increase in the potential difference between both ends of the resistor 104. Then, the voltage Vgs between the gate and source of the depletion type NMOS transistor 103 is decreased by the increase of the potential difference between both ends of the resistor 104. Accordingly, the current flowing through the PMOS transistor 101 is limited by the depletion type NMOS transistor 103 and the resistor 104 when the current flowing through the PMOS transistor 101 is increased to a certain level. As described above, the depletion type NMOS transistor 103 and the resistor 104 has a function of preventing a large feedthrough current from flowing through the path composed of the PMOS transistor 101 and the NMOS transistor 102.

When the current flowing through the resistor 104 is small, the potential difference between both ends of the resistor 104 is small enough to be negligible. This makes it possible to approximate the voltage between the gate and source of the depletion type NMOS transistor 103 as a voltage of around 0 V. If the current flowing through the resistor 104 is increased and the potential difference between both ends of the resistor 104 is also increased to a non-negligible level, the voltage between the gate and source of the depletion type NMOS transistor 103 assumes a negative value as viewed from the source terminal. Consequently, the depletion type NMOS transistor 103 functions so as to reduce current. In more detail, this circuit not only limits the maximum current value of the path composed of the PMOS transistor 101 and the NMOS transistor 102 using the maximum value of current that can flow through the depletion type NMOS transistor 103, but it also performs feedback of the potential difference occurring at the resistor 104 so that the current that can flow through the depletion type NMOS transistor 103 is reduced. In this manner, a current limitation effect is enhanced.

Figure 5:
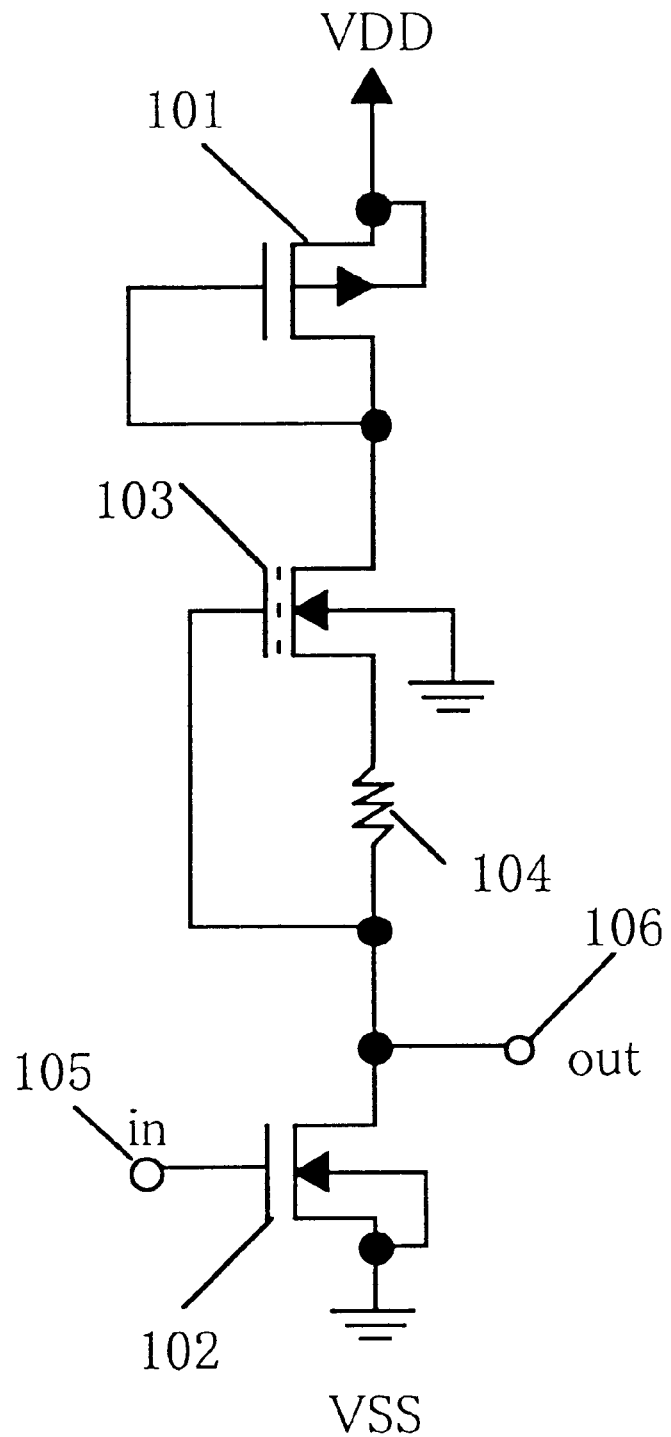
FIG. 5 shows the construction of another inverter circuit according to the present invention.
Figure 6:
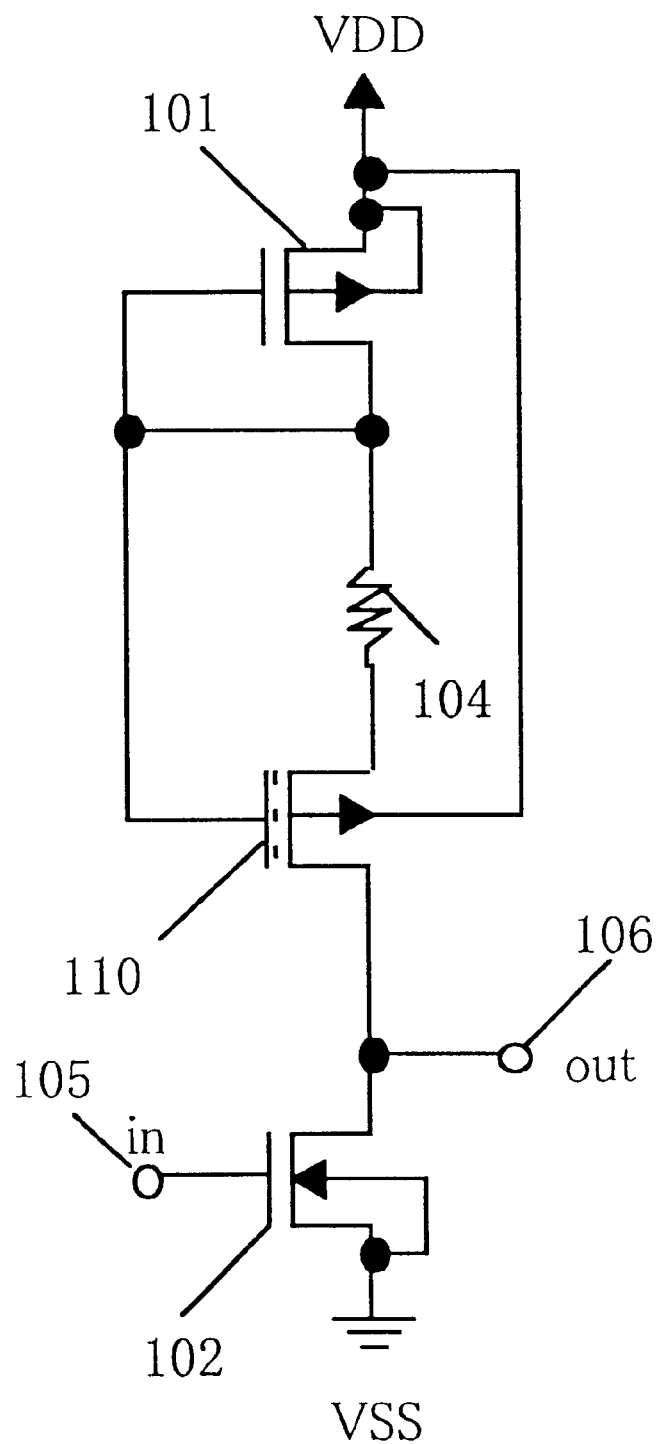
FIG. 6 shows the construction of still another inverter circuit according to the present invention.

The construction of the inverter circuit according to the present invention shown in FIG. 1 may be changed as shown in FIGS. 5 and 6, in which a saturation connection is established for the PMOS transistor and a signal is supplied from the gate of the NMOS transistor. Similar current limitation effects as those above are achieved using the arrangement shown in FIGS. 5 and 6.

Figure 3:
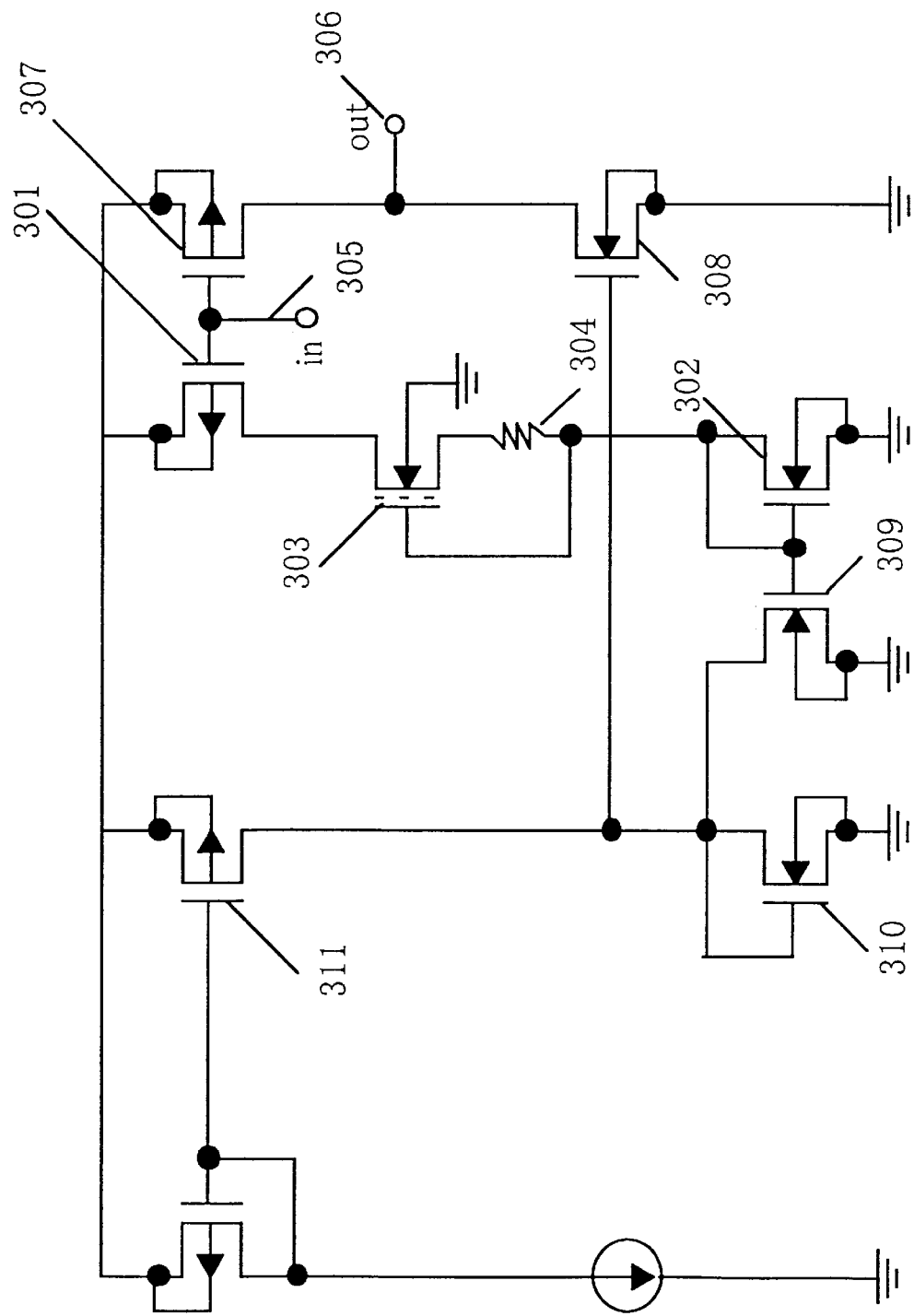
FIG. 3 shows the construction of an AB-class output circuit using the inverter circuit according to the present invention.

An example in which the inverter circuit according to the present invention is used is shown in FIG. 3. This drawing shows a construction of an AB-class output circuit. In FIG. 3, the inverter circuit according to the present invention is formed by the portion including a PMOS transistor 301, a depletion type NMOS transistor 303, a resistor 304, and an NMOS transistor 302. As above, an input terminal 305 connected with the gate of the PMOS transistor 301. The drain of the PMOS transistor 301 is connected with the drain of the depletion type NMOS transistor 303. The source of the depletion type NMOS transistor 303 is connected with one side of a resistor 304. The other side of the resistor 304 is connected with the gate of the depletion type NMOS transistor 303 and with the drain and gate of the NMOS transistor 302. The source of the NMOS transistor 302 is connected with VSS.

The AB-class output circuit shown in FIG. 3 operates as described below.

In FIG. 3, an input voltage is supplied from the input terminal 305. The gate terminal of a PMOS transistor 307 is also connected to the input terminal 305 of this output circuit. Accordingly, the input signal is amplified by the PMOS transistor 307 and is outputted to an output terminal 306.

The input signal is converted from a voltage to a current by the PMOS transistor 301 and becomes a drain current of the NMOS transistor 302. The drain current of the NMOS transistor 302 is equal to the drain current of an NMOS transistor 309 due to a current mirror construction if the NMOS transistor 309 operates in a saturation region. During this operation, a fluctuation in current at the NMOS transistor 309 is conveyed as a change in the drain current of a NMOS transistor 310. This is because the drain current of a PMOS transistor 311 assumes a constant value and is equal to the sum of the drain current of the NMOS transistor 310 and the drain current of the NMOS transistor 309. Also, the change of the drain current of the NMOS transistor 310 manifests itself as a change of the gate voltage of the NMOS transistor 310. This is because the drain terminal and gate terminal of the NMOS transistor 310 are short-circuited.

The gate terminal of the NMOS transistor 310 and the gate terminal of an NMOS transistor 308 are connected to each other, so that the change of the drain current of the NMOS transistor 310 is obtained as a change of the drain current of the NMOS transistor 308. Also, the change of the drain current of the NMOS transistor 308 manifests itself as a change of an output voltage due to an output impedance at the output terminal 306.

As can be understood from the above, a change of the input voltage at the input terminal 305 is amplified by both of the PMOS transistor 307 and the NMOS transistor 308 and manifests itself as an output voltage at the output terminal 306.

Figure 2:
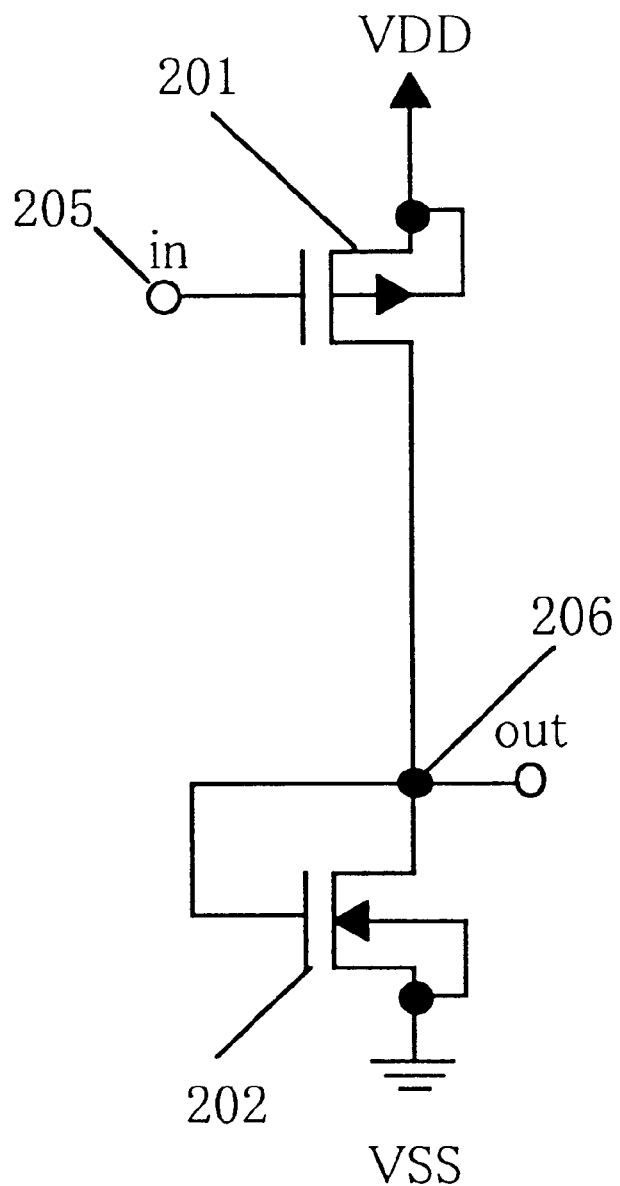
FIG. 2 shows the construction of a conventional inverter circuit.
Figure 4:
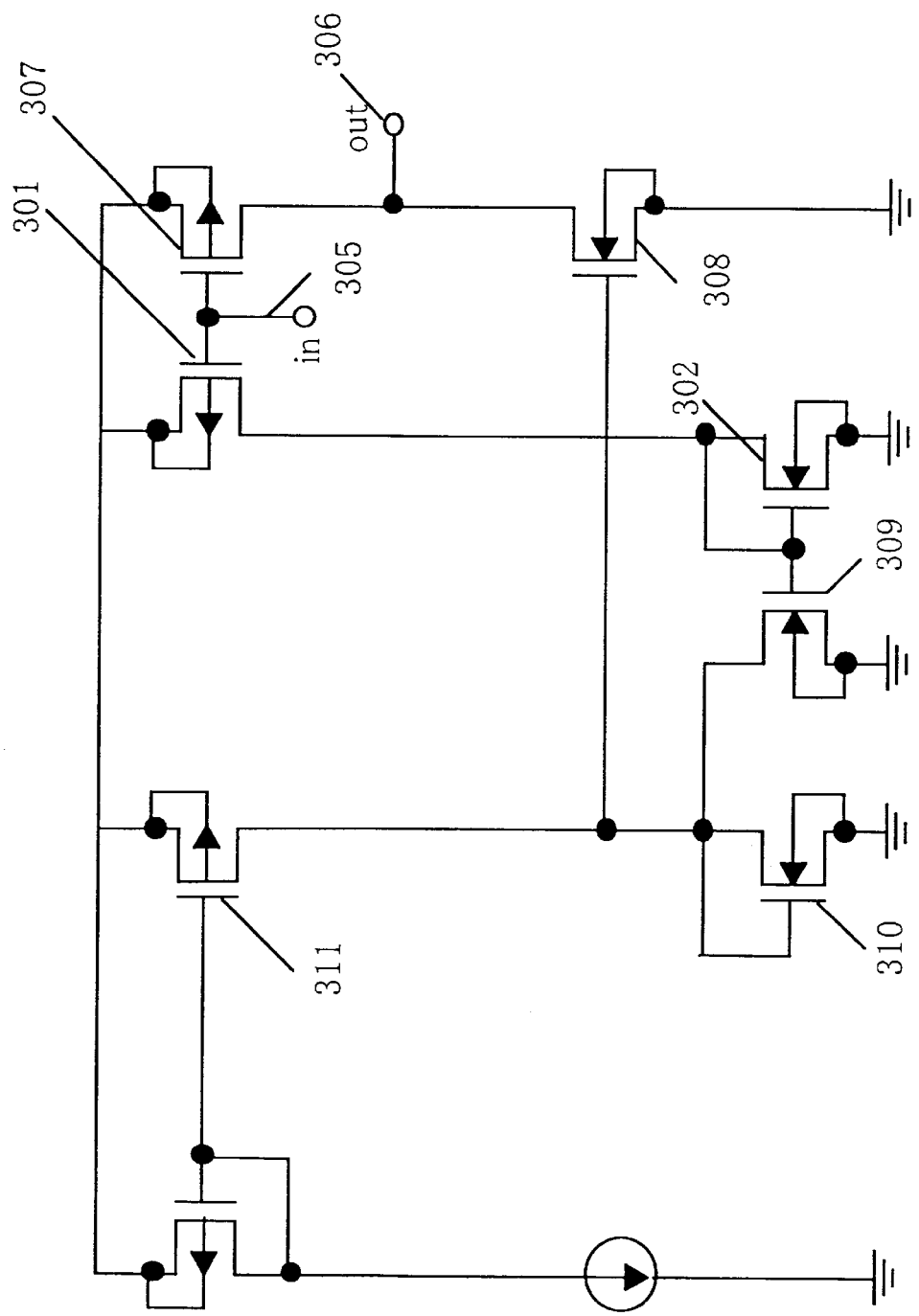
FIG. 4 shows the construction of an AB-class output circuit using the conventional inverter circuit.

FIG. 4 shows a conventional inverter with current mirror circuitry in which the portion constituting the inverter circuit according to the present invention by the PMOS transistor 301, the depletion type NMOS transistor 303, the resistor 304, and the NMOS transistor 302 does not include the depletion type NMOS transistor 303 and the resistor 304. In FIG. 4, if VSS is inputted into the input terminal 305, a large feedthrough current flows through the path composed of the PMOS transistor 301 and the NMOS transistor 302. Thus, the conventional inverter with current mirror circuitry illustrated in FIG. 4 has the same problem as the conventional inverter shown in FIG. 2. In the circuit shown in FIG. 3, however, a feedthrough current is reduced by the functioning of the depletion type NMOS transistor 303 and the resistor 304 as described above.

Another embodiment, illustrated in FIG. 5, is essentially the dual of the embodiment shown in FIG. 1. In FIG. 5, a voltage VDD is supplied to the source of the PMOS transistor 101. The drain of the PMOS transistor 101 is connected with the gate of the PMOS transistor 101 and the drain of the depletion type NMOS transistor 103. The source of the depletion type NMOS transistor 103 is connected with one side of a resistor 104. The other side of the resistor 104 is connected with the gate of the depletion type NMOS transistor 103 and with the drain of the NMOS transistor 102. The source of the NMOS transistor 102 is connected with VSS. An input signal is supplied to an input terminal 105 connected with the gate of the NMOS transistor 102 and an output signal is extracted from an output terminal 106 disposed at the drain of the NMOS transistor 102. Thus, rather than supplying the input signal to the gate of the PMOS transistor 101 and extracting the output signal from the drain of the PMOS transistor 101, the input signal is supplied to the gate of the NMOS transistor 102 and the output signal extracted from the drain of the NMOS transistor 102. The current limitation effect remains the same as in the other embodiments due to the addition of the depletion type NMOS transistor 103 and the resistor 104.

FIG. 6 illustrates another embodiment using a depletion type PMOS rather than a depletion type NMOS. In FIG. 6, a voltage VDD is supplied to the source of the PMOS transistor 101. The drain of the PMOS transistor 101 is connected with the gate of the PMOS transistor 101, with the gate of the depletion type PMOS transistor 103, and with one side of a resistor 104. The other side of the resistor 104 is connected with the source of the depletion type PMOS transistor 103. The drain of the depletion type PMOS transistor 103 is connected with the drain of the NMOS transistor 102. The source of the NMOS transistor 102 is connected with VSS. An input signal is supplied to an input terminal 105 connected with the gate of the NMOS transistor 102 and an output signal is extracted from an output terminal 106 disposed at the drain of the NMOS transistor 102. Similar to the embodiment shown in FIG. 5, the input signal is supplied to the gate of the NMOS transistor 102 and the output signal extracted from the source of the NMOS transistor 102. In addition, unlike the other embodiments, as the resistor 104 is connected between the source of the depletion type PMOS transistor 103 and the drain of the PMOS transistor 101 rather than between the drain of the depletion type PMOS transistor 103 and the drain of the NMOS transistor 102, the substrate of the depletion type PMOS transistor 103 is connected with VDD rather than VSS. The current limitation effect also remains the same as in the other embodiments due to the addition of the depletion type PMOS transistor 103 and the resistor 104.

The present invention is carried out in the manner described above and achieves the effects described below.

By combining a depletion type NMOS transistor with a resistor, it becomes possible to limit a feedthrough current. This prevents flow of unnecessary feedthrough current in an inverter circuit.

Also, in the case where the technique of the present invention is applied to an output circuit, a feedthrough current is similarly limited, thereby reducing the total current consumption. In addition, although NMOS and PMOS transistors are described herein, any conventional field-effect transistor may be used.

What is claimed is:

1. An inverter circuit comprising:
   an input terminal;
   an output terminal;
   a first MOS transistor including a first source terminal, a first gate terminal, and a first drain terminal, the first gate terminal being connected to the input terminal, and the first drain terminal being connected to the output terminal;
   a second MOS transistor including a second source terminal, a second gate terminal, and a second drain terminal, the second drain terminal being connected to the first drain terminal and the output terminal, the second source terminal being connected to one end of a resistive element, and the second gate terminal being connected to the other end of the resistive element; and
   a third MOS transistor including a third source terminal, a third gate terminal, and a third drain terminal, the third drain terminal being connected to a connection point of the third gate terminal, the second gate terminal, and the other end of the resistive element.

2. An inverter circuit according to claim 1, wherein the first source terminal is connected to a positive power supply voltage VDD and the third source terminal is connected to a negative power supply voltage VSS.

3. An inverter circuit according to claim 2, wherein the first MOS transistor is a P-type MOS transistor, and wherein each of the second MOS transistor and the third MOS transistor is an N-type MOS transistor.

4. An inverter circuit according to claim 3, wherein the second MOS transistor is of a depletion type.

5. An inverter circuit according to claim 1, wherein the third source terminal is connected to a positive power supply voltage VDD and the first source terminal is connected to a negative power supply voltage VSS.

6. An inverter circuit according to claim 5, wherein each of the second MOS transistor and the third MOS transistor is a P-type MOS transistor, and wherein the first MOS transistor is an N-type MOS transistor.

7. An inverter circuit according to claim 6, wherein the second MOS transistor is of a depletion type.

8. An inverter circuit comprising:
   an input terminal;
   an output terminal;
   a first field-effect transistor including a first source terminal, a first gate terminal, and a first drain terminal, the first gate terminal being connected to the input terminal, and the first drain terminal being connected to the output terminal;
   a second field-effect transistor including a second source terminal, a second gate terminal, and a second drain terminal, the second drain terminal being connected to the first drain terminal and the output terminal, the second source terminal being connected to one end of a resistive element, and the second gate terminal being connected to the other end of the resistive element; and
   a third field-effect transistor including a third source terminal, a third gate terminal, and a third drain terminal, the third drain terminal being connected to a connection point of the third gate terminal, the second gate terminal, and the other end of the resistive element.

9. An inverter circuit according to claim 8, wherein the first source terminal is connected to a positive power supply voltage VDD and the third source terminal is connected to a negative power supply voltage VSS.

10. An inverter circuit according to claim 9, wherein the first field-effect transistor is a P-type field-effect transistor, and wherein each of the second field-effect transistor and the third field-effect transistor is an N-type field-effect transistor.

11. An inverter circuit according to claim 10, wherein the second field-effect transistor is of a depletion type.

12. An inverter circuit according to claim 8, wherein the third source terminal is connected to a positive power supply voltage VDD and the first source terminal is connected to a negative power supply voltage VSS.

13. An inverter circuit according to claim 12, wherein each of the second field-effect transistor and the third field-effect transistor is a P-type field-effect transistor, and wherein the first field-effect transistor is an N-type field-effect transistor.

14. An inverter circuit according to claim 13, wherein the second field-effect transistor is of a depletion type.

* * * * *